United States Patent [19]
Bush et al.

[11] 3,979,679
[45] Sept. 7, 1976

[54] FM DEMODULATOR HAVING SQUELCH CIRCUIT USING BUCKET BRIGADE DELAY LINE

[75] Inventors: John A. Bush, Sunol; Drew R. Lance, Saratoga; John E. Altstatt, Palo Alto, all of Calif.

[73] Assignee: California Microwave, Inc., Sunnyvale, Calif.

[22] Filed: June 30, 1975

[21] Appl. No.: 591,533

[52] U.S. Cl. ............................. 325/348; 325/478
[51] Int. Cl.² ........................................ H04B 1/10
[58] Field of Search .............. 325/45, 65, 344, 348, 325/349, 371, 377, 379, 425, 427, 473, 477, 478; 329/110, 130; 328/165, 167

[56] References Cited
UNITED STATES PATENTS

| | | | |
|---|---|---|---|
| 2,756,328 | 7/1956 | Braak | 325/348 |
| 3,049,710 | 4/1962 | Buesing et al. | 325/478 |
| 3,568,068 | 3/1971 | Russell, Jr. | 325/348 |
| 3,588,705 | 6/1971 | Paine | 325/348 |
| 3,851,253 | 11/1974 | Eastmond | 325/348 |

*Primary Examiner*—Robert L. Griffin
*Assistant Examiner*—Jin F. Ng
*Attorney, Agent, or Firm*—Boone, Schatzel & Hamrick

[57] ABSTRACT

An improved squelch circuit for FM demodulators including a low pass filter for filtering out-of-band noise from the demodulator output signals, a delay line for time delaying the filtered signals, a gate for selectively passing the filtered demodulated output signals to an output terminal, and a control circuit for controlling the gate. The control circuit includes a high pass filter for passing the out-of-band noise in the demodulated signals, a detector for detecting the noise level of the noise passed by the high pass filter, and a comparator for comparing the detected out-of-band noise level to a reference to develop a gate control signal which causes the gate to be opened when the out-of-band noise level is relatively low and to be closed when the out-of-band noise level is relatively high.

8 Claims, 4 Drawing Figures

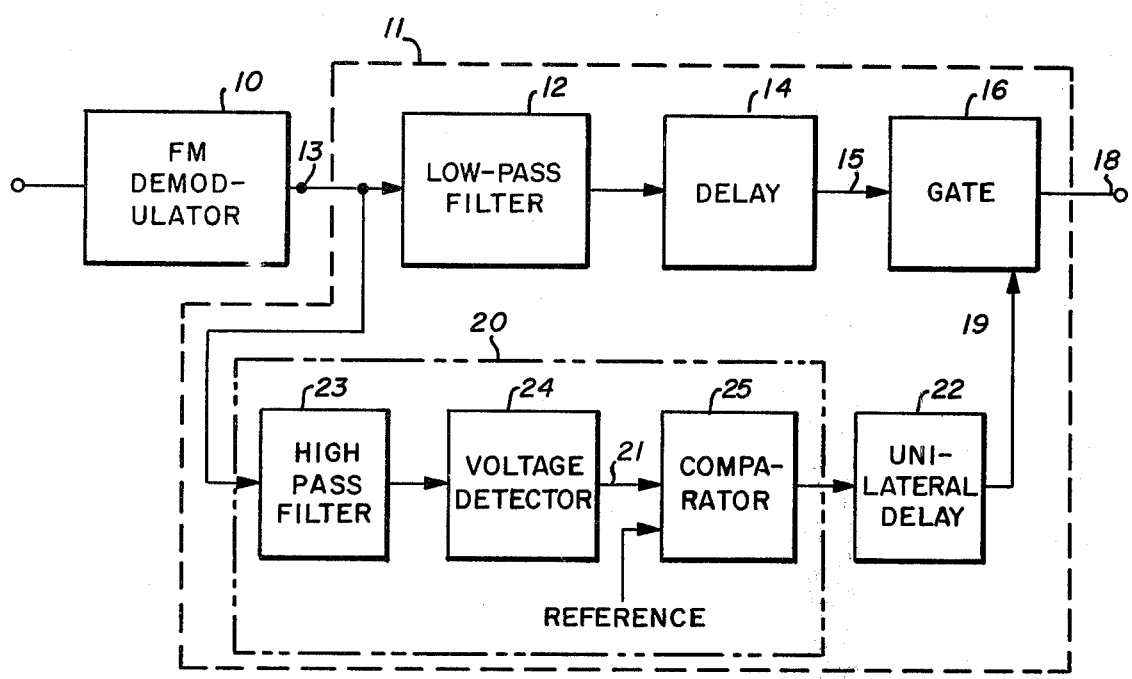
Fig_1
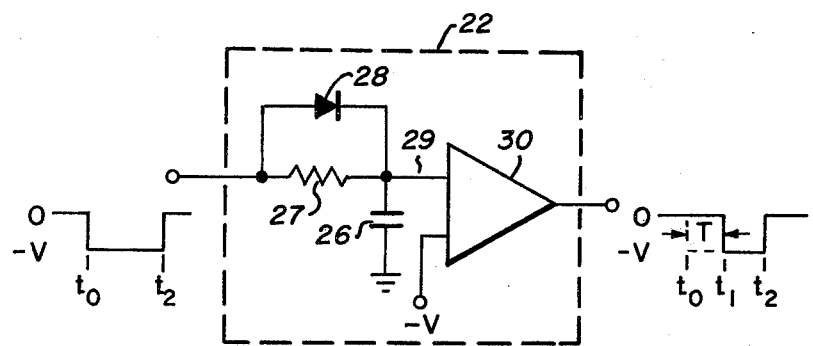
Fig_2

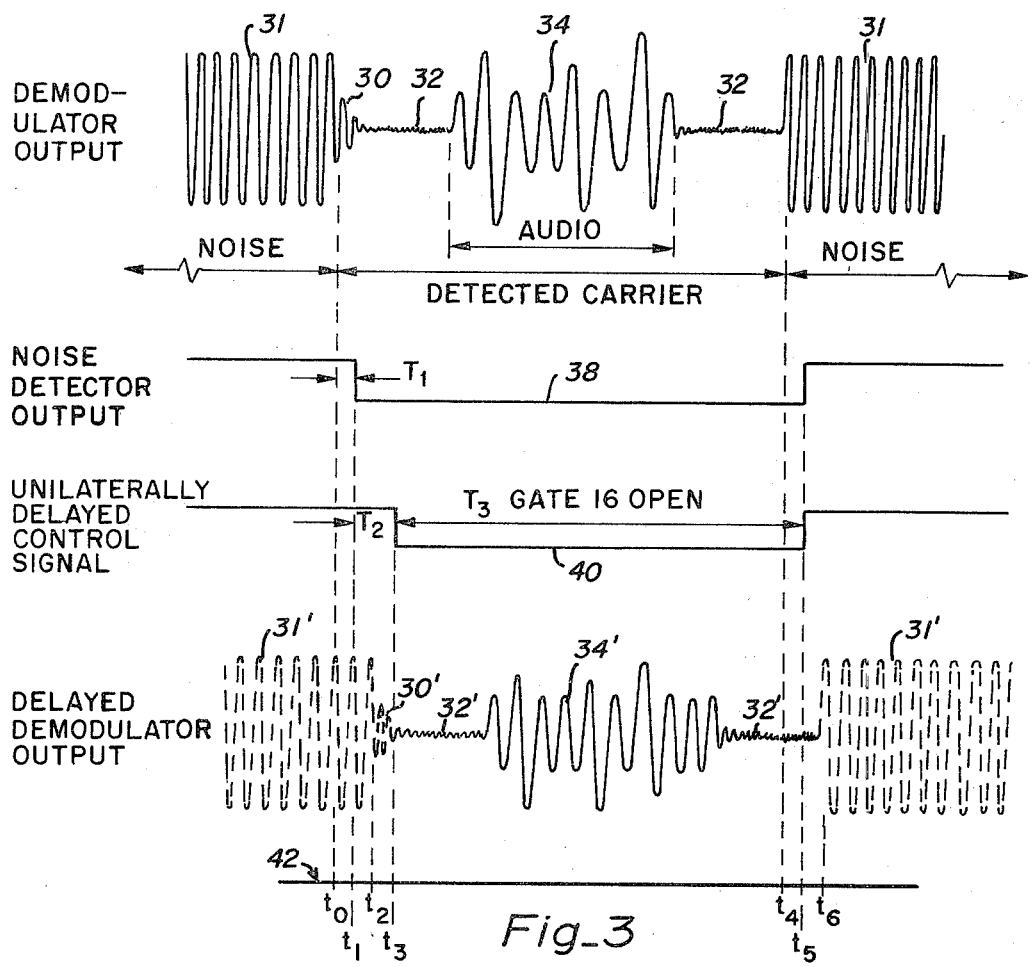
Fig_3
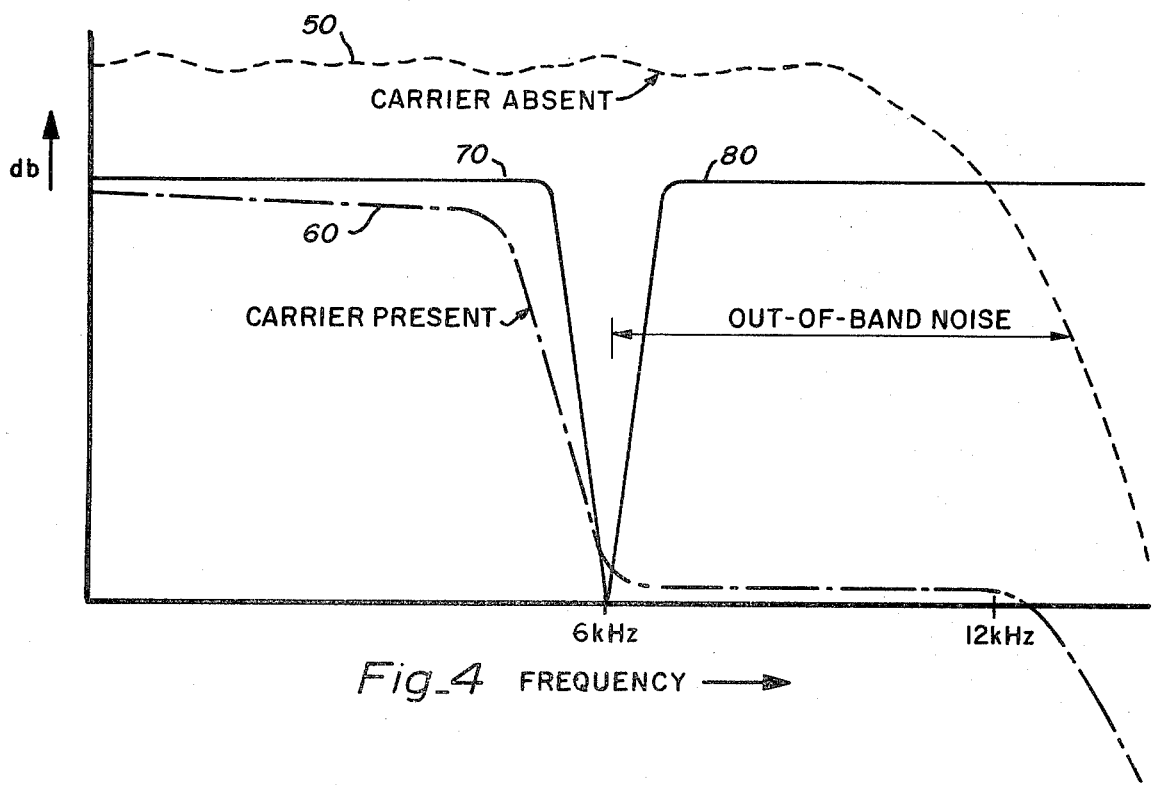
Fig_4 FREQUENCY →

FM DEMODULATOR HAVING SQUELCH CIRCUIT USING BUCKET BRIGADE DELAY LINE

BACKGROUND OF THE INVENTION

1. Field of the Invention

The present invention relates generally to FM communications equipment and more particularly to an improved squelch circuit for use with an FM demodulator to eliminate noise bursts at the beginning and end of a received transmission.

2. Description of the Prior Art

One of the most troublesome noise problems in radio communications is the noise bursts which frequently appear at the beginning and/or end of a demodulated transmission due to the finite times required to detect the commencement or termination of a signal and to thereafter activate or deactivate the receiver output circuits. These bursts are caused by short periods of noise signal, or settling transitions from noise-to-carrier-on and carrier-on-to-noise, which are allowed to pass through the audio circuit due to the inability of prior art receiver circuits to instantaneously recognize the presence or absence of carrier signal and to respectively open or close the audio circuit to prevent the passage of the noise components therethrough. Various types of squelch circuits have been used in the past in attempts to alleviate the problem but most such circuits merely attempt to mute the undesirable noise bursts rather than to eliminate them.

SUMMARY OF THE PRESENT INVENTION

It is therefore a primary object of the present invention to provide an improved demodulator squelch circuit which outputs demodulated signal only after carrier detection and settling has occurred, and terminates the output shortly before the end of the received transmission, thereby eliminating the brief noise bursts frequently output by prior art apparatus at the commencement and termination of a received transmission.

Briefly, a preferred embodiment of an improved squelch circuit in accordance with the present invention includes a low pass filter for passing audio signals, a delay line for delaying the audio signals passed by the low pass filter, a gate for selectively passing the audio signal, an out-of-band noise detection circuit for detecting noise in the demodulated signal input thereto and for generating a control signal for turning on the gate during the time that signal information is presented thereto, and a unilateral delay for delaying the leading edge of the control signal but not the trailing edge.

A principal advantage of the present invention is that noise signals occurring at the commencement and termination of a received transmission are eliminated from the information signal before that signal reaches the audio stages of the receiver.

Another advantage of the present invention is that the improved squelch circuit is provided utilizing readily available electronic components.

Other objects and advantages of the present invention will no doubt become apparent to those skilled in the art after having read the following detailed description of a preferred embodiment which is illustrated in the drawing.

IN THE DRAWING

FIG. 1 is a block diagram generally illustrating the principal components of an improved squelch circuit for an FM demodulator in accordance with the present invention;

FIG. 2 is a schematic diagram illustrating an example of a unilateral delay circuit of the type shown in FIG. 1;

FIG. 3 is a timing diagram schematically illustrating the operation of the apparatus shown in FIG. 1; and FIG. 4 is a diagram showing the relative band pass characteristics of the low pass filter and the high pass filter overlying curves representing the noise spectrum and the demodulated signal spectrum for the embodiment shown in FIG. 1.

DETAILED DESCRIPTION OF THE PREFERRED EMBODIMENT

In FIG. 1 of the drawing, there is shown an FM demodulator 10 in combination with an improved squelch circuit 11 in accordance with a preferred embodiment of the present invention. Demodulator 10 is of a type commonly used in FM communication systems to demodulate a frequency modulated signal and produce an audio frequency signal containing the transmitted information. As illustrated by the demodulator output curve shown in FIG. 3, the signal appearing at the output 13 of demodulator 10 will consist of either high level noise when no carrier is being received or low level noise and audio frequency signal information when a carrier is detected.

This characteristic of the demodulator output can be illustrated in another form by the curves 50 and 60 of FIG. 4. As indicated by curve 50, in the absence of a received transmission, i.e., no carrier detected, the output of demodulator 10 will be in the form of broad band high level noise. However, when a carrier is detected, the demodulator selectively discriminates against noise, and particularly against those noise frequencies lying outside the audio frequency range of interest (out-of-band noise) as indicated by curve 60. The squelch circuit of the present invention utilizes this inherent change in out-of-band noise level at the demodulator output to detect the presence or absence of a transmission.

Referring now back to FIG. 1, squelch circuit 11 includes a low pass filter 12 for passing frequencies up to approximately 6 KHz. It functions in the squelch circuit to remove any high frequency noise components from the demodulated signal and to filter out any high frequency harmonics of the demodulated audio signal. The demodulated signal must be free of high frequency harmonics in order for delay 14 to operate properly (as will be discussed below).

Delay 14 may take the form of any suitable audio frequency delay device, but in the preferred embodiment it is a sampling delay device generally referred to as a bucket brigade delay which can accurately delay signals of frequencies throughout the demodulation frequency range of demodulator 10. However, since this type of delay device is also capable of sampling high frequency components, it is essential that any signal to be delayed is free of high frequency harmonics because such harmonics would cause delay 14 to generate low frequency noise in the delayed signal. Hence, it is important that filter 12 remove high frequency harmonics from the demodulated audio signal.

Gate 16 is essentially a switch which is actuated by a D-C control signal applied to its control input 19 and operates to pass signals to output terminal 18 without distortion. Earphones, an audio amplifying circuit or other suitable means for utilizing the transmitted information may be connected to output terminal 18.

Noise detector 20 detects the reduction of a high frequency noise signal level in the out-of-band spectrum, i.e., above 6 KHz, and generates a control signal for actuating gate 16. Detector 20 includes a high pass filter 23, a voltage detector 24 and a comparator 25. Filter 23 is of a high pass configuration which passes only signals above 6 KHz frequency and blocks signals having frequencies within the range of the human voice. Voltage detector 24 receives the signals passed by filter 23 and develops a DC voltage at 21 which is proportional to the average amplitude of the noise signals received.

Comparator 25 is an ordinary voltage comparison circuit capable of comparing the output of detector 24 to a reference voltage and generating a negative going DC control signal when the voltage input at 21 is less than the reference voltage. In a preferred embodiment the output of comparator 25 is zero volts when the input at 21 is greater than the reference voltage, and is of a predetermined negative voltage −V when the input at 21 is less than the reference voltage.

For reasons to be explained in more detail below, unilateral delay 22 is a device capable of delaying the leading edge of the control signal developed by comparator 25 but of passing the trailing edge of the control signal without delay. One such device is shown schematically in FIG. 2 and includes a capacitive storage element 26, a resistor 27, a diode 28, and comparator 30. The respective resistive and capacitive values of resistor 27 and capacitor 26 are selected so as to provide an RC time constant which will produce the desired signal delay. Comparator 30 develops a zero volt output when the potential on its input 29 is more positive than −V volts and a −V volt output when the potential on its input 29 is −V. Thus, when the output of comparator 25 changes from zero volts to −V volts capacitor 26 will be charged through resistor 27 to a potential of −V volts in a time $T = 1/RC$. Since the output of comparator 30 will not change until the potential on input 29 equals the reference voltage −V, the effect is to delay the leading edge of the control signal by the time T. However, when the output of comparator 25 changes back to zero, capacitor 26 will immediately discharge to zero through diode 28 causing the output of comparator 30 to change back to zero with no delay. Thus, the overall effect of unilateral delay 22 is to delay the leading edge of the control signal without delaying the trailing edge.

FIG. 3 illustrates a waveform typical of that which might appear at output 13 of demodulator 10 along with waveforms depicting the output signals developed by detector 24 and unilateral delay 22. For purposes of illustration, the output of demodulator 10 is shown to include noise segments 31 (no carrier detected) separated by an interval of detected carrier 32 including an audio containing segment 34. The transitional segment 30 which results as the demodulator output settles from a noisy to a quiet condition is also considered as noise.

Waveform 38 represents the control signal developed by out-of-band noise detector 20. It should be noted that the detector output 38 is slightly delayed due to the detection time $T_1$ required by detector 20 to accurately detect the changes from noise to carrier and carrier to noise and to generate and terminate the control signal. Waveform 40 illustrates the unilaterally delayed control signal and corresponds to the binary or two level actual period of time $T_3$ that gate 16 is open as determined by the control signal after its leading edge is delayed by time period $T_2$. Note that the trailing edge of control signal 40 is not delayed.

The delayed demodulator output presented at the input 15 of gate 16 is shown at the bottom of FIG. 3. The noise segments 31' are shown dashed for purposes of illustration since those noise signals are substantially eliminated by filter 12. Note that holding gate 16 closed for the period $T_2$ after the carrier is detected allows the detected signal transitions 30' to settle out before the gate is opened at time $T_3$. Similarly, by not delaying the trailing edge of the control signal, gate 16 is caused to close at time $T_5$ before the delayed carrier terminates at $T_6$.

Time scale 42 illustrates the real time relation between the various curves depicted in FIG. 3. As shown, carrier commencement and hence cessation of noise 30 occurs at time $T_0$. The finite amount of time necessary for noise detector 20 to detect the cessation of noise and to generate the undelayed control signal 38 is represented by the time period between $T_0$ and $T_1$. At time $T_1$ the control signal 38 is generated by detector 20 and this signal is delayed by delay 22 so as not to open gate 16 until time $T_3$. Since the delayed carrier signal occurs at time $T_2$, the interim between $T_2$ and $T_3$ allows the carrier to settle, thus avoiding the transitional noise signals. Gate 16 is then closed at time $T_5$ which occurs a signal recognition time period following the actual termination of transmission at $T_4$ and slightly before the delayed termination at $T_6$.

FIG. 4 illustrates the relationships between the noise spectrum 50 present at the output of demodulator 10 when no transmitted signal is being received, the band pass characteristic 70 of low pass filter 12, the band pass characteristic 80 of high pass filter 23, and the carrier detected frequency response characteristic 60 of demodulator 10. As may be observed from this illustration, a substantial reduction occurs in the out-of-band noise generated at the output of demodulator 10 when a transmitted carrier is detected by the demodulator. Since this inherent noise reduction may be easily detected, its occurrence is used in the present invention as the condition upon which a control signal is generated.

More specifically, since the input to voltage detector 24 is frequency limited by filter 23 to include only the out-of-band noise as indicated in the drawing, detector 24 may be comprised of a simple broad band voltage level detector which generates an output at 21 that is commensurate with the detected noise levels. Thus, by setting the reference voltage of comparator 25 at some value intermediate the two noise levels, an accurate carrier detection function can be effected even though either or both of the respective out-of-band noise levels may vary somewhat.

While there has been described what is at present considered to be a preferred embodiment of the invention, it will be understood that various alterations and modifications may be made therein and it is intended that the appended claims cover all such alterations and modifications as fall within the true spirit and scope of the invention.

What is claimed is:

1. In an FM receiver including a demodulator for demodulating audio signals from a frequency-modulated carrier transmission and a squelch circuit for coupling the demodulated audio signals to a receiver output terminal, an improved squelch circuit comprising:
   first filter means coupled to the output of the demodulator and having a first pass band for passing the demodulated audio signals and for rejecting noise signals having frequencies outside of said first pass band;
   first delay means for delaying the filtered audio signals for a first predetermined period of time;
   noise detector means coupled to the output of the demodulator for distinguishing between the noise level of said noise signals when a transmission is being received and the noise level of said noise signals when no transmission is being received, and for developing a control signal when a transmission is being received, said control signal being a binary signal having a leading edge and a trailing edge;
   second delay means for delaying the leading edge of said control signal for a second predetermined period of time, said second period of time being less than said first period of time; and
   gate means for coupling said filtered audio signals to the receiver output terminal in response to the delayed control signal.

2. In an FM receiver circuit as recited in claim 1 wherein said noise detector means includes:
   second filter means coupled to the output of the demodulator and having a second pass band for passing said noise signals and for rejecting said audio signals;
   voltage detector means responsive to said noise signals and operative to develop a noise voltage commensurate with the noise level thereof; and
   comparator means for comparing said noise voltage to a reference voltage and for generating said control signal when said noise voltage exceeds said reference voltage.

3. In an FM receiver circuit as recited in claim 1 wherein said second delay means includes a shunt-connected capacitance, a series-connected resistance, a diode connected in parallel with said resistance, and a comparator means for comparing the charge on said capacitance to a reference and for generating an output only when said charge equals or exceeds said reference, said diode being polarized to cause said control signal to charge said capacitance through said resistance but to discharge said capacitance independent of said resistance.

4. In an FM receiver circuit as recited in claim 1 wherein said first delay means includes a bucket brigade delay line for time-delaying the filtered audio signal.

5. A squelch circuit for processing demodulated FM signals comprising:
   first filter means having an input terminal for connection to the output of an FM demodulator and having a first pass band for passing demodulated audio signals and for rejecting demodulator output noise signals having frequencies outside of said first pass band;
   first delay means for time-delaying the filtered audio signals;
   an output terminal;
   noise detector means coupled to said input terminal, said noise detector means being capable of distinguishing between demodulator output noise signals developed in the presence of a received carrier and demodulator output noise signals developed in the absence of a received carrier, and operative to generate a binary control signal having a leading edge and a trailing edge when said received carrier is present;
   second delay means for delaying the leading edge of said control signal for a second predetermined period of time, said second period of time being less than said first period of time and gate means for coupling said time-delayed audio signals to said output terminal in response to the delayed control signal.

6. A squelch circuit as recited in claim 5 wherein said noise detector means includes:
   second filter means having a second pass band for passing said noise signals and for rejecting said audio signals;
   voltage detector means responsive to said noise signals and operative to develop a noise voltage commensurate with the noise level thereof; and
   comparator means for comparing said noise voltage to a reference voltage and for generating said control signal when said noise voltage exceeds said reference voltage.

7. A squelch circuit as recited in claim 5 wherein said second delay means includes a shunt-connected capacitance, a series-connected resistance, a diode connected in parallel with said resistance, and a comparator means for comparing the charge on said capacitance to a reference and for generating an output only when said charge equals or exceeds said reference, said diode being polarized to cause said control signal to charge said capacitance through said resistance but to discharge said capacitance independent of said resistance.

8. In an FM receiver circuit as recited in claim 5 wherein said first delay means includes a bucket brigade delay line for time-delaying the filtered audio signal.

* * * * *

United States Patent Office

CERTIFICATE OF CORRECTION

Patent No. 3,979,679    Dated September 7, 1976

Inventor(s) John A. Bush; Drew R. Lance; and John E. Alstatt

It is certified that error appears in the above-identified patent and that said Letters Patent are hereby corrected as shown below:

Column 3, line 65, after "the" insert --binary or two level--,

Column 4, line 4, delete "binary or";

Column 4, line 5, delete "two level".

Signed and Sealed this

Ninth Day of November 1976

[SEAL]

Attest:

RUTH C. MASON
*Attesting Officer*

C. MARSHALL DANN
*Commissioner of Patents and Trademarks*